(12) United States Patent
Patel et al.

(10) Patent No.: US 7,286,349 B2
(45) Date of Patent: Oct. 23, 2007

(54) VENTILATED CASING FOR AN ELECTRONIC DEVICE

(75) Inventors: Chandrakant D. Patel, Fremont, CA (US); Wade D. Vinson, Magnolia, TX (US); Rich Bargerhuff, Spring, TX (US)

(73) Assignee: Hewlett-Packard Development Copmpany, L.P., Houston, TX (US)

( * ) Notice: Subject to any disclaimer, the term of this patent is extended or adjusted under 35 U.S.C. 154(b) by 222 days.

(21) Appl. No.: 10/989,924

(22) Filed: Nov. 16, 2004

(65) Prior Publication Data

US 2006/0104029 A1   May 18, 2006

(51) Int. Cl.
*H05K 7/20* (2006.01)
(52) U.S. Cl. ............................. 361/695; 454/184
(58) Field of Classification Search ............. None
See application file for complete search history.

(56) References Cited

U.S. PATENT DOCUMENTS

| | | | |
|---|---|---|---|
| 4,807,718 A * | 2/1989 | Lotz | 181/202 |
| 5,177,666 A | 1/1993 | Bland et al. | |
| 5,208,730 A * | 5/1993 | Tracy | 361/687 |
| 5,917,698 A * | 6/1999 | Viallet | 361/695 |
| 6,351,380 B1* | 2/2002 | Curlee et al. | 361/695 |
| 6,421,240 B1 | 7/2002 | Patel et al. | |
| 6,526,333 B1 | 2/2003 | Henderson et al. | |
| 6,601,168 B1 | 7/2003 | Stancil et al. | |
| 6,639,796 B2* | 10/2003 | Cannon | 361/695 |
| 6,836,030 B2 | 12/2004 | Smith et al. | |
| 6,894,897 B1* | 5/2005 | Nagurny et al. | 361/695 |
| 7,126,818 B2* | 10/2006 | Lu et al. | 361/695 |
| 2002/0015287 A1* | 2/2002 | Shao | 361/695 |
| 2003/0112601 A1 | 6/2003 | Smith et al. | |

FOREIGN PATENT DOCUMENTS

| | | |
|---|---|---|
| DE | 10202814 | 8/2003 |
| GB | 2107787 | 5/1983 |
| JP | 5-167280 * | 2/1993 |

* cited by examiner

*Primary Examiner*—Gregory D Thompson

(57) ABSTRACT

The present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The fan has a blade, a motor and an air guiding portion positioned near the blade. The ventilated casing further includes a damping material for damping a noise originating from a vibration generated by the fan.

17 Claims, 3 Drawing Sheets

VENTILATED CASING FOR AN ELECTRONIC DEVICE

FIELD OF THE INVENTION

The present invention relates to a ventilated casing for an electronic device and particularly, although not exclusively, to a ventilated casing for an electronic device having a high speed and high pressure fan.

BACKGROUND OF THE INVENTION

The ongoing performance increase of electronic devices usually requires an increase in device density. Large numbers of single electrical components are integrated to form an integrated component and many of such integrated components are placed into relatively small cases such as the cases of computer servers, laptop computers or other electronic devices.

For example, each casing for a server unit may be a narrow blade and a large number of such blades are positioned in close proximity in dedicated racks. A new generation of such blades has a thickness of only 1 U which corresponds to 1.75 inches or 4.445 cm. For example, a standard rack of 187 cm height is suitable to store 42 of such server blades on top of each other. Alternatively, the server blades may be vertical blades having a width of 1 U or less.

Such narrow blade servers increase the number of server components that may be placed in the rack if the package density of the electronic components in each casing can be increased. In order to guarantee satisfactory operation of the closely packed electronic components confined in such small spaces, heat developed by the electronic components needs to be dissipated.

Fans are usually used to dissipate heat developed by the electronic components of electronic server units. Fans of conventional electronic server units often have a normal operation speed which is only approximately 3600 rpm. However, if the package density and therefore the amount of heat that is generated per volume is further increased, higher mass flow is required to ensure that the electronic components are not overheated. Further, because of the increased package density, the flow resistance is also increased and a higher pressure needs to be provided in order to enable the higher mass flow and therefore avoid overheating. Accordingly, there is a need for an advanced technical solution.

SUMMARY OF THE INVENTION

Briefly, the present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The high speed fan has a blade, a motor and an air guiding portion positioned near the blade. The ventilated casing further includes a damping material for damping a noise originating from a vibration generated by the fan.

The invention will be more fully understood from the following description of embodiments of the ventilated casing. The description is provided with reference to the accompanying drawings.

DETAILED DESCRIPTION OF EMBODIMENTS

Figure 1A:
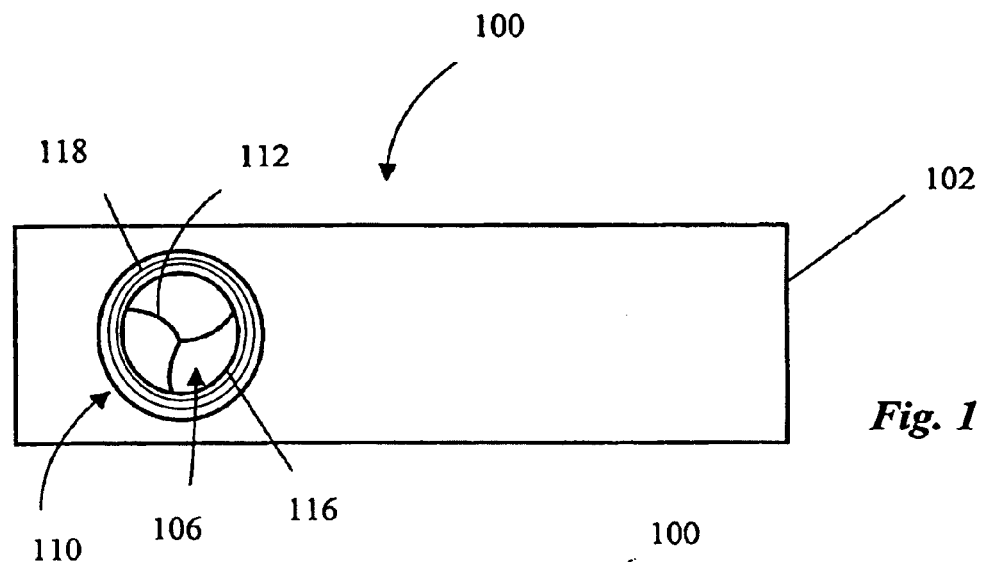
FIG. 1A is a rear view of a ventilated casing for an electronic device according to an embodiment of the invention.
Figure 1B:
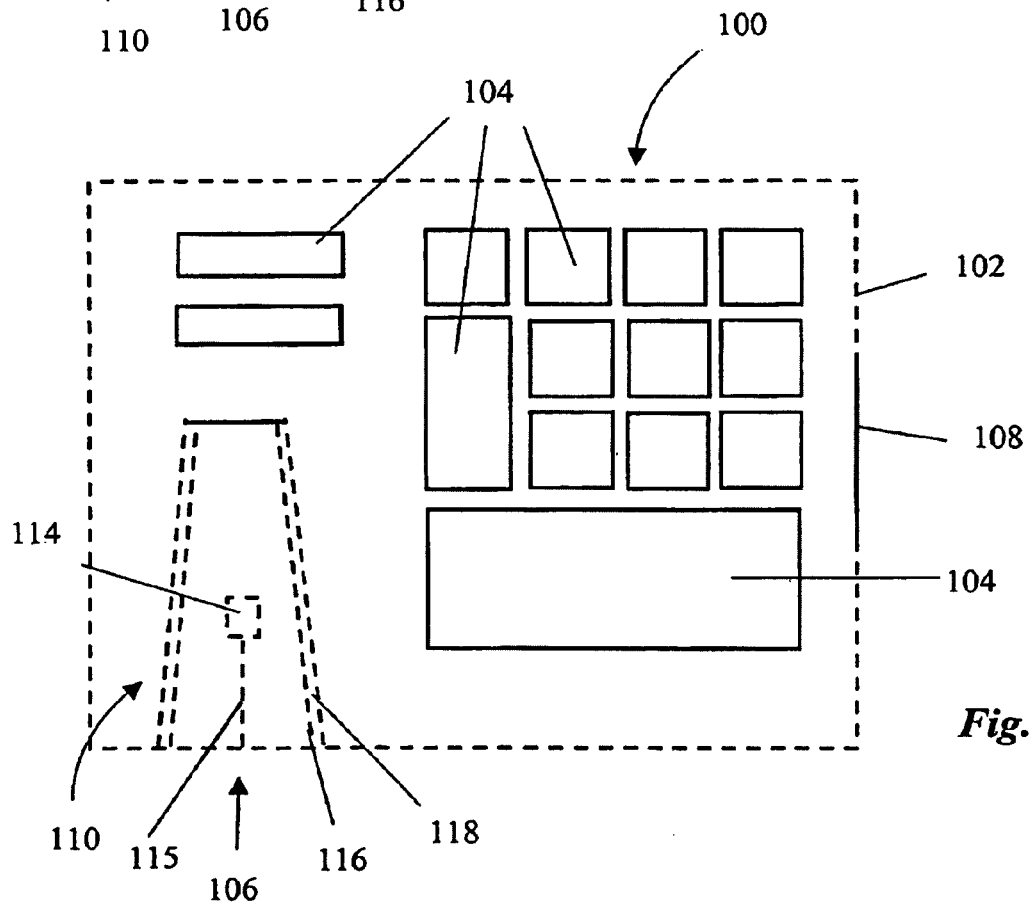
FIG. 1B is cross-sectional view of the ventilated casing shown in FIG. 1A.

Referring initially to FIGS. 1A and 1B, a ventilated casing for an electronic device according to an embodiment is now described. FIG. 1A shows a rear view of a ventilated casing 100 for an electronic device and FIG. 1B shows a cross-sectional view of the ventilated casing 100. In this embodiment the ventilated casing 100 is provided with electronic components 104. The ventilated casing 100 with the electronic components 104 form an electronic device. The ventilated casing 100 includes a housing 102 in which the electronic components 104 are positioned. The ventilated housing 102 has air inlet opening 106 and an air outlet opening 108.

For example, the ventilated casing 100 may be a casing for a server blade which may be positioned, together with a large number of other blades, in a rack. In a specific example, the casing 100 has a height of 1 U which corresponds to 1.75 inches or 4.445 cm. The casing 100 typically includes a large number of the electronic components 104, such as server electronic components. Such a 1 U server blade has the advantage that it uses only minimum space. However, if the electronic components 104 are closely packed, the heat that is generated per volume may be substantial. In this case cooling provided by a conventional fan in a conventional ventilated casing may not be sufficient. Further, if the electronic components 104 are densely packed in the confined interior space of the housing 102, the air pressure of a conventional fan may not be sufficient.

In this embodiment, the ventilated casing 100 includes a high speed axial fan 110 having blades 112 on a shaft 115 coupled to motor a 114. The shaft 115 is supported in bearings by a support structure (not shown). The fan 110 also has an air guiding portion which in this embodiment is provided in form of a cowling 116 in which the support structure is positioned. In this example the fan 110 has an operation speed of approximately 36,000 rpm. In general a suitable high speed fan has a normal operation speed that is greater than 3,600 rpm, such as greater than 10,000 rpm, 20,000 rpm or 30,000 rpm. Because of the high speed, the fan 110 provides high mass flow of cooling air. In a variation of this embodiment, the casing 100 may include two or more fans 110 which would provide even more cooling air. Further, in this embodiment the fan 110 has relatively deep blades 112 (the fan 110 has depth that is larger than the width of the fan 110). Consequently, due to the depth of the blades 112, high pressure is provided for ventilating densely packed casings.

In use, the fan 110 transports ventilation air from ventilation inlet opening 106 through the interior space of the ventilated casing 100 and through the ventilation opening 108. However, in operation the "turbine" fan 110 develops a relatively loud and disturbing noise. For example, if the fan 110 operates at a speed of 36,000 rpm, which corresponds to 600 rotations per second, mechanical vibrations having a frequency of approximately 600 Hertz are generated which causes the noise.

Fans of existing electronic devices often also cause vibrations, but since they operate at speeds that are significantly lower, typically of the order of 3600 rpm, the frequency of the vibration is much lower (60 Hertz), coupling of the vibration with surrounding parts is less likely and the generated noise is less disturbing. The noise having a frequency of approximately 600 Hz that is generated by the fan 110 of the ventilated casing 100, however, is in a frequency range to which the human ear has a relatively high sensitivity. Further, mechanical components of the ventilated casing 100 may have resonant frequencies that are in the proximity of this frequency and their vibrations would cause an amplification of the noise.

To reduce the noise that originates from mechanical vibrations, such as from vibrations of fan cowling 116, the electronic components 104 or other components of the ventilated casing 100, in this embodiment a dampening material 118 is positioned adjacent the cowling 116. The damping material 118 surrounds and isolates the cowling 116 and in use reduces the amplitude of the vibrations of the cowling 116. Further, the dampening material 118 dampens the amplitude of a sound wave that originates from the vibrating cowling 116. Consequently, the ventilated casing 100 has the significant advantage in that sufficient cooling for densely packaged electronic components 104 may be provided while the noise of the fan is significantly reduced.

In this embodiment the dampening material 118 is a material of a layered structure. The dampening material 118 includes a viscos-elastic or thermoplastic polymeric material that is sandwiched between metallic layers (such as aluminium layers). Typically, the layered structure has a thickness of 1-2 mm.

In alternative embodiments the metallic layers of the dampening material 118 may be replaced by other suitable materials such as suitable polymeric materials or other types of metallic materials. It is also to be appreciated that the layered structure may include a range of additional layers. Alternatively, the dampening material 118, which may or may not be provided in form of a layered structure, may include other materials such as any suitable elastic polymeric material, a rubber-like material, or any suitable foam or polyurethane material.

Figure 2:
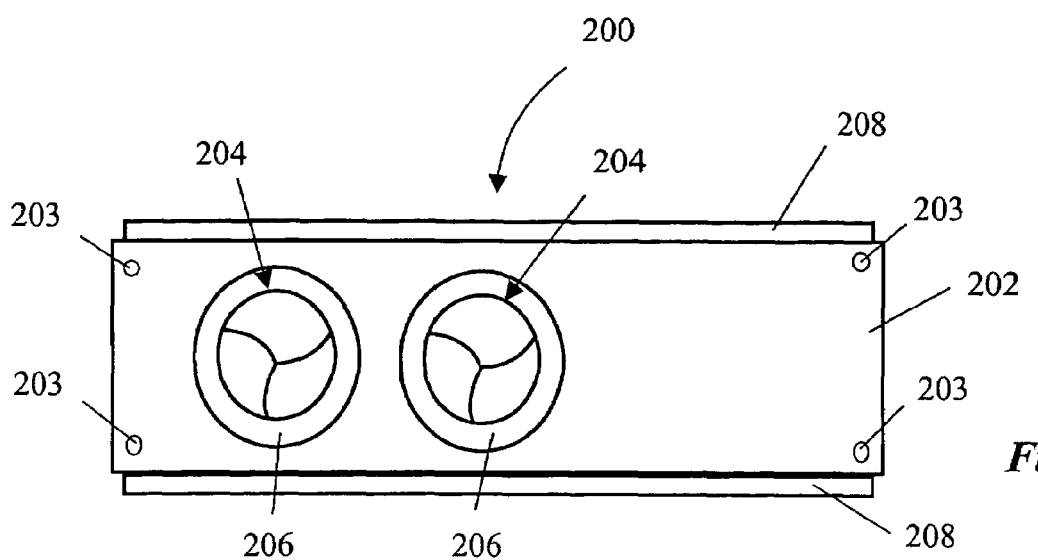
FIG. 2 is a rear view of a ventilated casing according to another embodiment of the present invention.

FIG. 2 shows a ventilated casing according to a further embodiment. In this case, the ventilated casing 200 also includes a housing 202 and two fans 204 each being identical with the fan 110 shown in FIGS. 1A and 1B. The two fans 204 provide sufficient cooling for a particularly densely packed 1 U casing. In this embodiment each fan 204 is surrounded by a dampening material 206 similar to that of dampening material 118 shown in FIGS. 1A and 1B and discussed above. To provide for additional dampening of a noise generated by a vibration originating from the fans 204, the ventilated casing 200 includes further dampening material 208 positioned on two opposing sides of the housing 202. In this embodiment the dampening material 208 is identical with the dampening material 206. It is to be appreciated that the dampening material 206 may be positioned on any portion of the housing 202. The damping material 308 and the damping material 306 may also be different damping materials. The housing 202 includes screw holes 203 for mounting the ventilated casing 200 in a rack.

Figure 3:
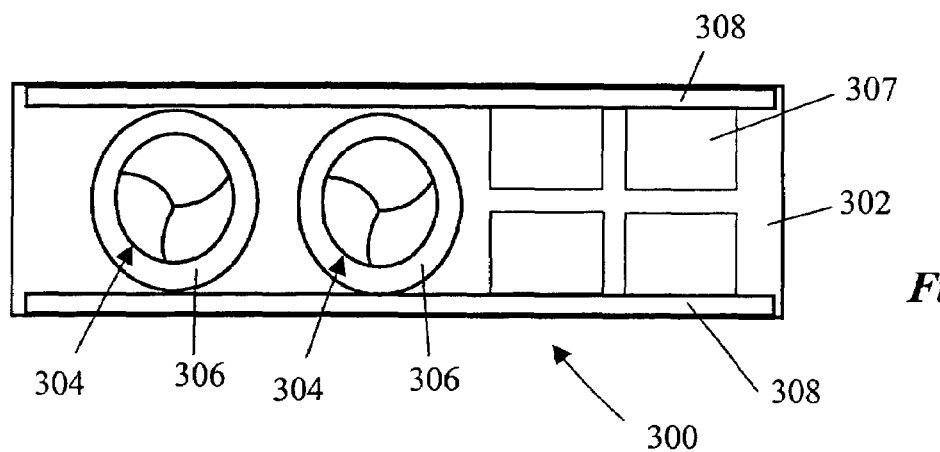
FIG. 3 is a rear view of a ventilated casing according to a further embodiment of the present invention.

FIG. 3 shows a ventilated casing 300 according to a further specific embodiment. FIG. 3 shows the ventilated casing 300 with a side portion of housing 302 removed and FIG. 3 therefore shows a view of the interior of the ventilated casing 300. In this embodiment, the ventilated casing 300 includes electronic components 307 and a pair of fans 304, each identical with fan 204 or fan 110 as discussed above. Again, each fan 304 is surrounded by a dampening material 306 which is identical with the dampening material 118 or 206 discussed above. In this embodiment, further dampening material 308 is positioned on opposing inner portions of the housing 302 which provides for additional damping of a noise originating from the fans 304. It is to be appreciated that the further dampening material 308 may alternatively be positioned on any inner portion of the housing 302. Further, it is to be appreciated that the damping material 308 and the damping material 306 may be different damping materials.

Figure 4:
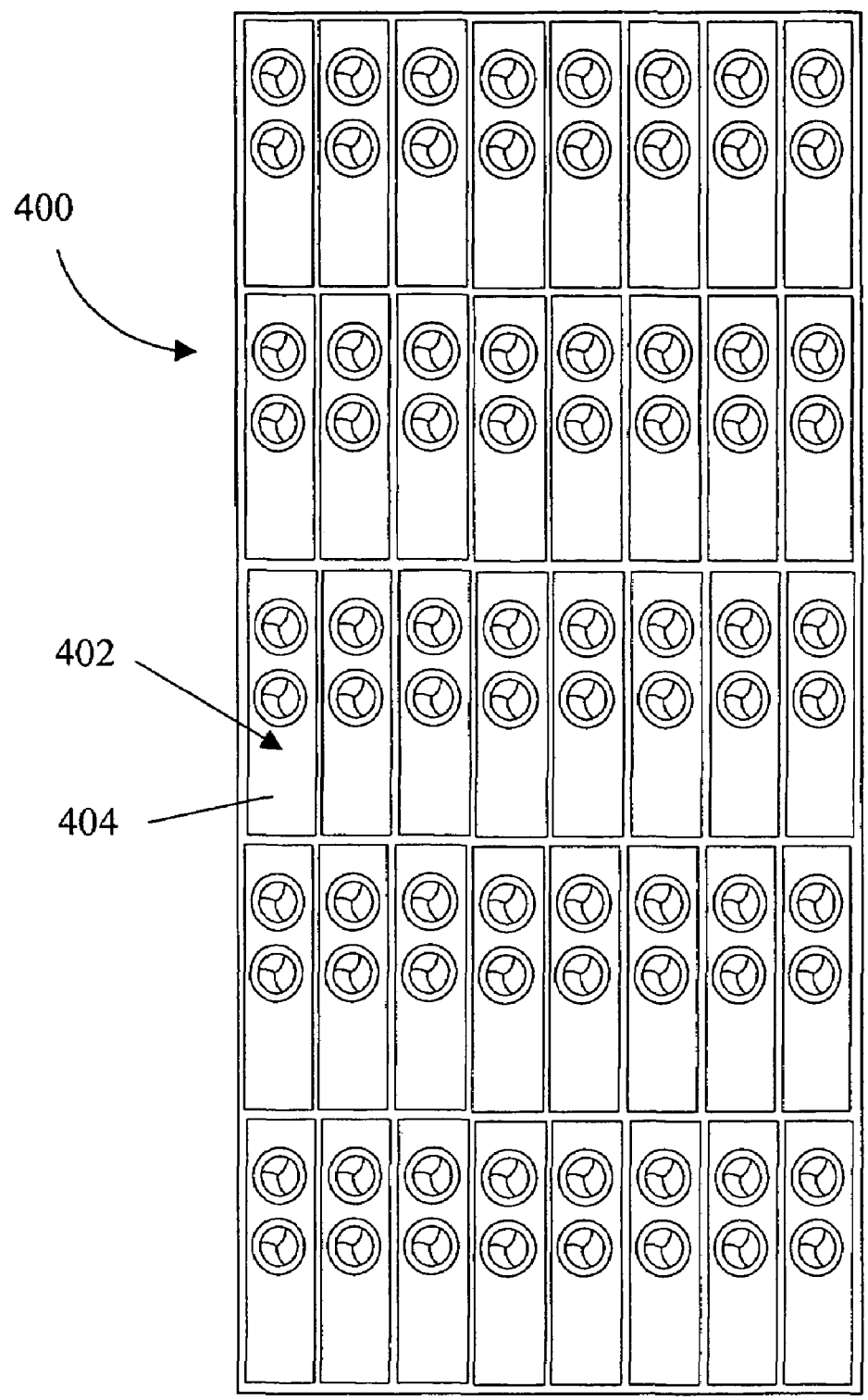
FIG. 4 is a rear view of a rack with ventilated casings for electronic devices according to another embodiment of the present invention.

FIG. 4 shows a rear view of a rack 400 including a plurality of server blades 402. Each server blade 402 includes a ventilated casing 404 that is identical with the ventilated casing 300 shown in FIG. 3. In this embodiment, a large number of the server blades 402 are positioned closely packed in the rack 400.

Although the invention has been described with reference to particular examples, it will be appreciated by those skilled in the art that the invention may be embodied in many other forms. For example, it is to be appreciated that the dampening material may not necessarily surround the cowlings of the fans. In alternative embodiments the dampening material may be positioned between the cowlings of the fans and the housing and may not necessarily contract the cowlings or the housings.

Further, it is to be appreciated that the fan may not necessarily be a high speed and high pressure fan of the type discussed above and may also not necessarily include a cowling. For example, if the electronic components are less densely packed, it would be sufficient to use a fan that operates at a lower speed and provide less pressure. Also more than one fan may be stacked behind each other. In addition, the ventilated casing may not necessarily be a casing that is arranged to be positioned in a rack such as rack 400. For example, in an alternative embodiment, the ventilated casing may be a casing of a laptop computer or may be of any other suitable shape or size.

What is claimed is:

1. A ventilated casing for an electronic device, the ventilated casing comprising:
   a housing having a ventilation inlet and a ventilation outlet;
   a fan for moving air from the ventilation inlet to the ventilation outlet to dissipate heat that in use is generated by electronic components positioned in the housing, the fan having a blade, a motor and an air guiding cowling that surrounds the blade; and
   a damping material carried on the cowling and surrounding the blade, the damping material being configured for damping a noise originating from a vibration generated by the fan.

2. The ventilated casing of claim 1 and further comprising:
   a second damping material extending along an external side of the housing.

3. The ventilated casing of claim 2 wherein:
   the second damping material is positioned on an external surface of the external side of the housing.

4. The ventilated casing of claim 2 wherein:
the second damping material is positioned on an internal surface of the external side of the housing.

5. The ventilated casing of claim 1 wherein:
the damping material comprises a viscoelastic material.

6. The ventilated casing of claim 1 wherein:
the damping material comprises a structure including at least three layers, each layer being composed of a material different than that of adjoining layers.

7. The ventilated casing of claim 1 wherein:
the damping material comprises polymeric material.

8. The ventilated casing of claim 1 wherein:
the fan has an operating speed of more than 15,000 rpm.

9. The ventilated casing of claim 1 wherein:
the fan has an operating speed of more than 30,000 rpm.

10. The ventilated casing of claim 1 wherein:
the fan is one of two fans and the damping material in use damps an amplitude of a vibration of at least one of the air guiding portions and the housing.

11. The ventilated casing of claim 1 wherein:
the fan blade is an axial fan blade that is deeper than it is wide.

12. The ventilated casing of claim 8 wherein:
the fan blade is an axial fan blade that is deeper than it is wide.

13. The ventilated casing of claim 9 wherein:
the fan blade is an axial fan blade that is deeper than it is wide.

14. A blade-casing for an electronic device, the blade-casing comprising:
a housing having a ventilation inlet and a ventilation outlet;
a mount for mounting the housing in a rack,
a fan for moving air from the ventilation inlet to the ventilation outlet to dissipate heat that in use is generated by electronic components positioned in the housing, the fan having a blade, a motor and an air guiding cowling that surrounds the blade; and
a damping material carried on the cowling and surrounding the blade, the damping material being configured for damping a noise originating from a vibration generated by the fan.

15. The blade-casing of claim 14 wherein:
the housing has substantially the shape of a rectangular prism and is shaped for placement in a 1 U rack system.

16. An electronic device comprising:
a housing having a ventilation inlet and a ventilation outlet;
electronic components positioned in the housing;
a fan for moving air from the ventilation inlet to the ventilation outlet to dissipate heat that in use is generated by the electronic components positioned in the housing, the fan having a blade, a motor and an air guiding cowling that surrounds the blade; and
a damping material carried on the cowling and surrounding the blade, the damping material being configured for damping a noise originating from a vibration generated by the fan.

17. A method of cooling electronic components in a housing, the method comprising the steps of:
directing air from a ventilation inlet to the ventilation outlet of the housing to dissipate heat generated by the electronic components, the air being directed using a fan having a blade, a motor and an air guiding cowling that surrounds the blade, and
damping a noise originating from a vibration generated by the fan using a damping material carried on the cowling and surrounding the blade, the damping material being configured for damping a noise originating from a vibration generated by the fan.

* * * * *

UNITED STATES PATENT AND TRADEMARK OFFICE
CERTIFICATE OF CORRECTION

| | | |
|---|---|---|
| PATENT NO. | : 7,286,349 B2 | Page 1 of 1 |
| APPLICATION NO. | : 10/989924 | |
| DATED | : October 23, 2007 | |
| INVENTOR(S) | : Chandrakant D. Patel et al. | |

It is certified that error appears in the above-identified patent and that said Letters Patent is hereby corrected as shown below:

On the title page, item (73), under "Assignee", in column 1, line 2, delete "Copmpany" and insert -- Company --, therefor.

Signed and Sealed this

Twenty-third Day of June, 2009

JOHN DOLL
*Acting Director of the United States Patent and Trademark Office*